US012777970B2

(12) United States Patent
Van der Sijde et al.

(10) Patent No.: US 12,777,970 B2
(45) Date of Patent: Oct. 27, 2026

(54) COMBINED LED AND SENSOR ARRANGEMENT

(71) Applicant: Lumileds LLC, San Jose, CA (US)

(72) Inventors: Arjen Gerben Van der Sijde, Eindhoven (NL); Nicola Bettina Pfeffer, Eindhoven (NL); Pieter Johannes Quintus van Voorst Vader, Son (NL)

(73) Assignee: Lumileds LLC, San Jose, CA (US)

( * ) Notice: Subject to any disclaimer, the term of this patent is extended or adjusted under 35 U.S.C. 154(b) by 570 days.

(21) Appl. No.: 18/070,740

(22) Filed: Nov. 29, 2022

(65) Prior Publication Data

US 2023/0167970 A1 Jun. 1, 2023

Related U.S. Application Data

(60) Provisional application No. 63/284,953, filed on Dec. 1, 2021.

(51) Int. Cl.
*H10W 90/00* (2026.01)
*G03B 15/05* (2021.01)
(Continued)

(52) U.S. Cl.
CPC ............ *H10W 90/00* (2026.01); *G03B 15/05* (2013.01); *H05B 45/12* (2020.01);
(Continued)

(58) Field of Classification Search
CPC .......... H10F 39/18–1898; H05B 45/12; H05B 47/105; H05B 47/11; H05B 45/22;
(Continued)

(56) References Cited

U.S. PATENT DOCUMENTS 10,593,841 B2 3/2020 Vampola et al.
2005/0250997 A1* 11/2005 Takeda .............. A61B 5/14551 600/310

(Continued)

FOREIGN PATENT DOCUMENTS

CN 118648109 9/2024
JP 2004112034 A 4/2004

(Continued)

OTHER PUBLICATIONS

"International Application Serial No. PCT US2022 051143, International Preliminary Report on Patentability mailed Jun. 13, 2024", 6 pages.

(Continued)

*Primary Examiner* — Ismail A Muse
(74) *Attorney, Agent, or Firm* — Schwegman, Lundberg & Woessner, P.A.

(57) ABSTRACT

A mobile device contains an integrated structure (e.g., a semiconductor structure) that includes an LED matrix with one or more LED arrays and sensors on at least opposing edges of the LED matrix. Each LED array has LEDs that are separated by non-emitting areas and the LEDs are independently driven to provide light. The light is converted to white light using a phosphor disposed on the LEDs. The sensors detect ambient light or flicker. The semiconductor structure is attached to a semiconductor driver via conductive pillars and underfill between the conductive pillars. The driver is coupled to a PCB. The PCB is electrically coupled to the semiconductor structure via PCB contacts and LED contacts to drive the LEDs dependent on the ambient light.

20 Claims, 9 Drawing Sheets

(51) Int. Cl.

| | |
|---|---|
| ***H05B 45/12*** | (2020.01) |
| ***H05K 1/181*** | (2026.01) |
| ***H05K 3/341*** | (2026.01) |

(52) U.S. Cl.
CPC ...... *G03B 2215/0567* (2013.01); *H05K 1/181* (2013.01); *H05K 3/341* (2013.01)

(58) Field of Classification Search
CPC .................... H10W 90/00; G03B 15/05; G03B 2215/0567; G03B 30/00; H05K 1/181; H05K 3/341; F21V 23/005; F21Y 2115/10; H10H 20/851; H10H 20/855
See application file for complete search history.

(56) References Cited

U.S. PATENT DOCUMENTS

| | | | | |
|---|---|---|---|---|
| 2007/0090282 | A1* | 4/2007 | Chin .................. | G01D 5/34715 250/231.13 |
| 2017/0164848 | A1* | 6/2017 | Nadeau .............. | A61B 5/14552 |
| 2018/0007759 | A1 | 1/2018 | Yan et al. | |
| 2018/0286837 | A1 | 10/2018 | Makanoeich et al. | |
| 2018/0303359 | A1* | 10/2018 | O'Brien ................ | H10F 77/413 |
| 2019/0090766 | A1* | 3/2019 | Block ..................... | H10F 55/20 |
| 2019/0157508 | A1 | 5/2019 | Choi et al. | |
| 2020/0251049 | A1 | 8/2020 | Morris et al. | |
| 2021/0249759 | A1* | 8/2021 | Jeon ......................... | H01Q 1/38 |
| 2021/0288008 | A1 | 9/2021 | Deckers et al. | |
| 2021/0381960 | A1* | 12/2021 | Na ........................ | G01S 7/4816 |
| 2021/0405313 | A1* | 12/2021 | Kani ........................ | H01L 24/43 |
| 2023/0267883 | A1* | 8/2023 | Long .................... | G09G 3/3233 345/205 |

FOREIGN PATENT DOCUMENTS

| | | | |
|---|---|---|---|
| JP | 2019505069 | A | 2/2019 |
| JP | 2020095963 | A | 6/2020 |
| JP | 2021114614 | A | 8/2021 |
| KR | 20190008562 | | 1/2019 |
| KR | 20190098199 | A | 8/2019 |
| WO | WO-2019050939 | A1 | 3/2019 |
| WO | WO-2021102097 | A1 | 5/2021 |
| WO | 2023101922 | | 6/2023 |

OTHER PUBLICATIONS

"European Application Serial No. 22902057.3, Voluntary Amendment filed Oct. 7, 2024", 11 pages.
"International Application Serial No. PCT/US2022/051143, International Search Report mailed Apr. 19, 2023", 4 pgs.
"International Application Serial No. PCT/US2022/051143, Written Opinion mailed Apr. 19, 2023", 4 pgs.
"Japanese Application Serial No. 2024-532680, Notification of Reasons for Rejection mailed Jun. 3, 2025", W/English Translation, 11 pgs.
"European Application Serial No. 22902057.3, Extended European Search Report mailed Oct. 14, 2025", 8 pgs.
"Japanese Application Serial No. 2024-532680, Examiners Decision of Final Refusal mailed Oct. 14, 2025", W/English Translation, 6 pgs.
"Korean Application Serial No. 10-2024-7021703, Notice of Preliminary Rejection mailed Nov. 28, 2025", with English translation, 13 pages.

* cited by examiner

COMBINED LED AND SENSOR ARRANGEMENT

PRIORITY CLAIM

This application claims the benefit of priority to U.S. Provisional Patent Application Ser. No. 63/284,953, filed Dec. 1, 2021, which is incorporated herein by reference in its entirety.

FIELD OF THE DISCLOSURE

The present disclosure relates to an illumination system that contains a light-emitting diode (LED) array and sensor on a printed circuit board (PCB).

BACKGROUND OF THE DISCLOSURE

There is ongoing effort to improve illumination systems. In particular, it is desired to provide tunable lighting in commercial and home lighting environments.

BRIEF DESCRIPTION OF THE DRAWINGS

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

Real estate (e.g., a physical area or volume that may be available for a given device) is at a premium in many electronic devices. It is, however, difficult to reduce the size of mobile devices in particular due to the increasing complexity of such devices. One of the components that attracts a large amount of attention in mobile devices is the camera, which may have one or more different types of sensors and be used in conjunction with a flash module. Integration of the flash module and camera to reduce the overall size may be complicated, in particular in terms of semiconductor fabrication as well as circuit and board layout.

Figure 1:
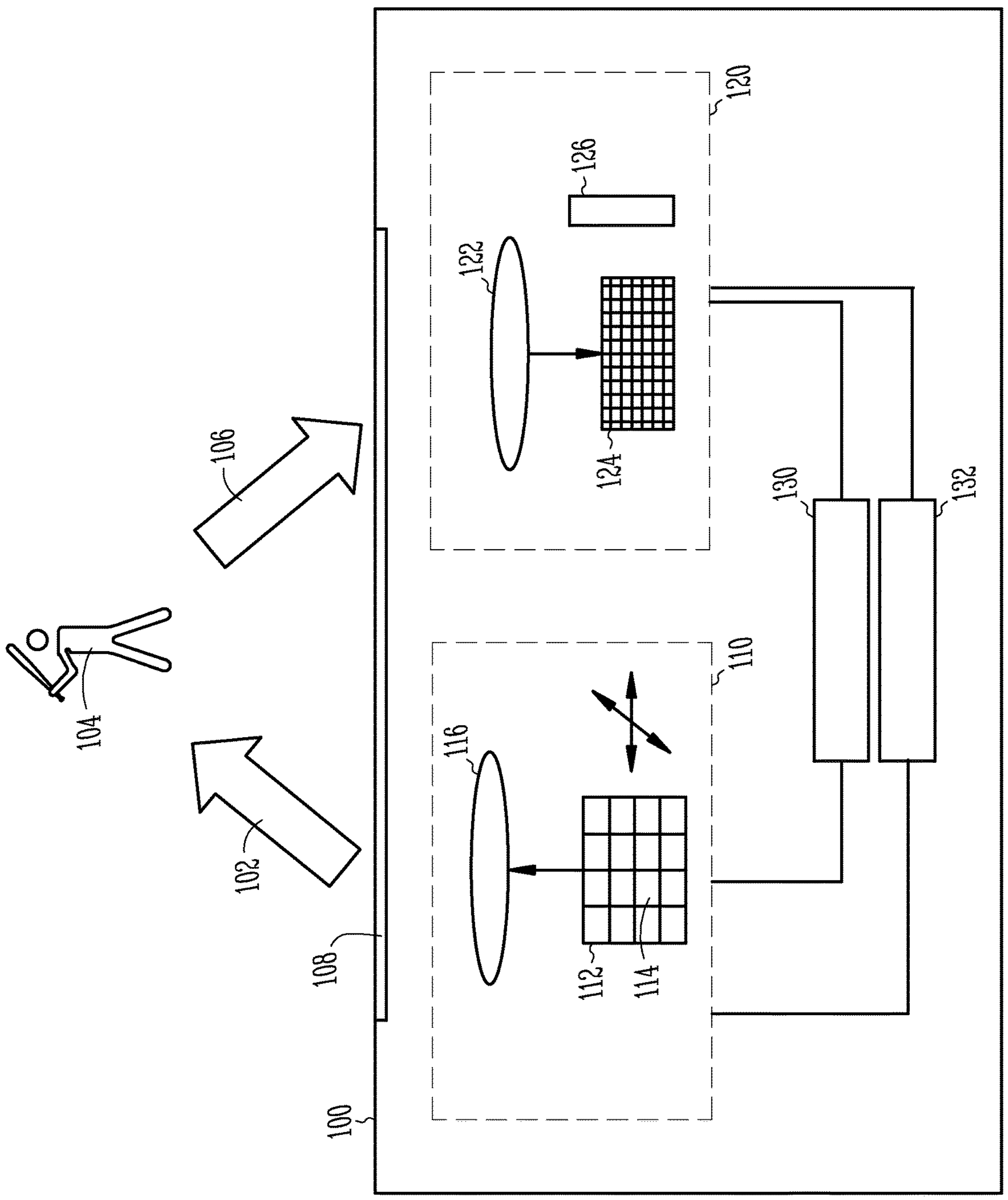
FIG. 1 shows a side view of a mobile device, in accordance with some examples.

FIG. 1 shows a side view of a mobile device 100, in accordance with some examples. The mobile device 100 may include both a flash module 110 and a camera 120. The camera 120 can capture an image of a scene 104 during an exposure duration of the camera 120, whether or not the scene 104 is illuminated by the flash module 110. A processor 130 may be used to control various functions of the flash module 110 and the camera 120, including, for example, whether or not a shutter is open in an opening 108 of a housing of the mobile device 100. The opening 108 may be a single opening as shown in FIG. 1 or may include multiple separate openings. Similarly, the shutter may be a single shutter that covers both the flash module 110 and the camera 120 or may include multiple separate shutters that cover only one of the flash module 110 or the camera 120 and are individually controllable by the processor 130.

The mobile device 100 can include one or more light-emitting diode (LED) arrays 112. The one or more LED arrays 112 can include a plurality of LEDs 114 that can produce light during at least a portion of the exposure duration of the camera 120. Each of the one or more LED arrays 112 may contain segmented ones of the LEDs 114. Each of the LEDs 114 may be formed from one or more inorganic materials (e.g., binary compounds such as gallium arsenide (GaAs), ternary compounds such as aluminum gallium arsenide (AlGaAs), quaternary compounds such as indium gallium phosphide (InGaAsP), or other suitable materials). Each of the LEDs 114 emits light in the visible spectrum (about 400 nm to about 800 nm) and may also emit light in the infrared spectrum (above about 800 nm). Alternatively, a separate one or more LED arrays may be used to emit light in the infrared spectrum, with each of the LEDs 114 being individually controllable by the processor 130.

Figure 2:
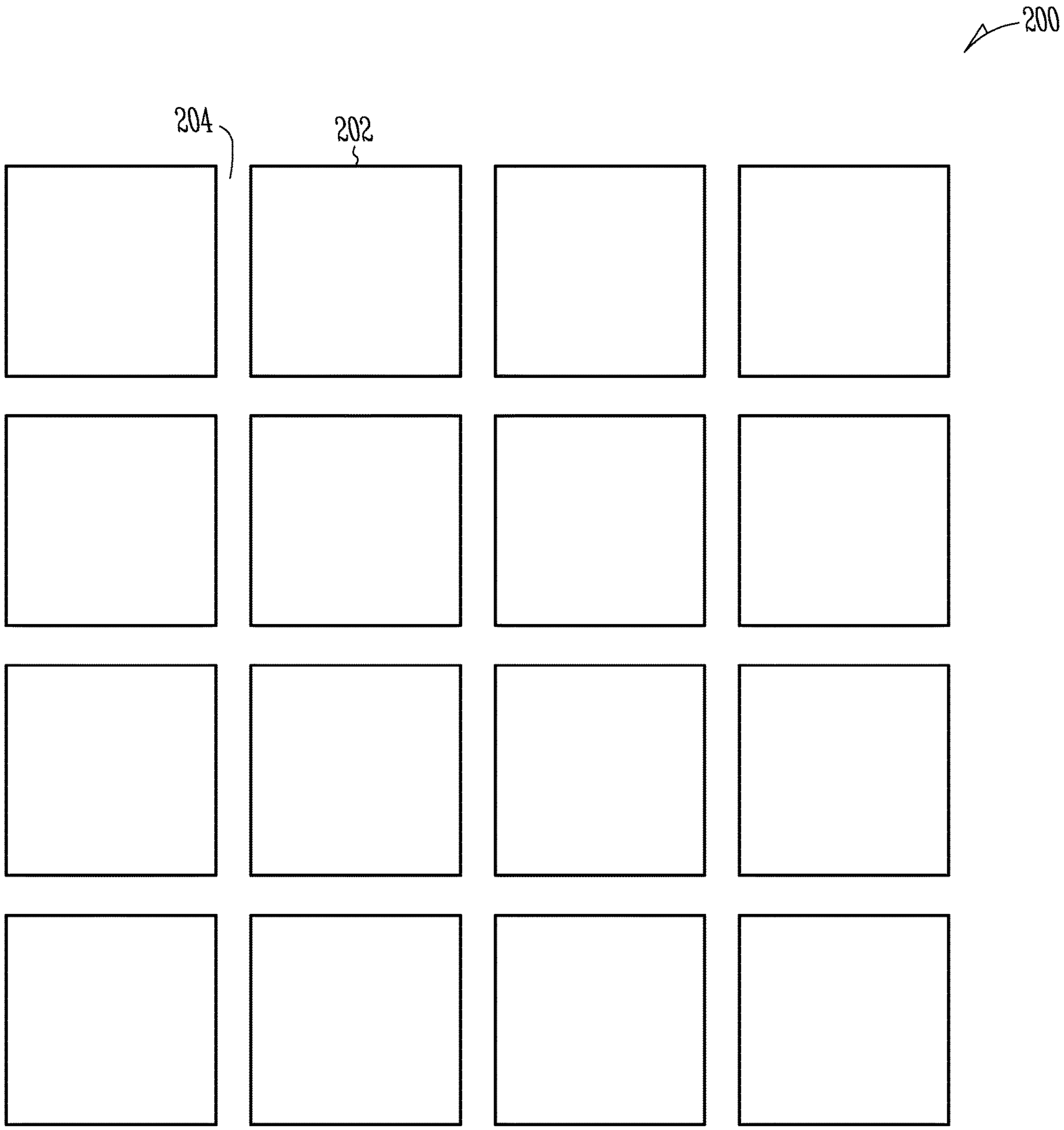
FIG. 2 illustrates an LED array, in accordance with some examples.

The one or more LED arrays 112 can include one or more non-emitting areas (e.g., non-emitting areas 204) located between adjacent ones of the LEDs 114, as shown in FIG. 2. The size of the non-emitting areas located between adjacent ones of the LEDs 114 (i.e., the distance between adjacent ones of the LEDs 114) may be significant (e.g., from about 5% to about 10%) as compared with the physical size of the LEDs 114 (i.e., the distance between adjacent sides of the LED 114) in the one or more LED arrays 112. In some examples, one or more of the non-emitting areas can surround the LEDs 114 in the one or more LED arrays 112, which may cause dark bands to appear in the illumination emitted by the one or more LED arrays 112. In some examples, the non-emitting areas may be relatively small enough and optical elements or other elements in the flash module 110 to negate the effects of the non-emitting areas.

The flash module 110 can include at least one lens 116 or other optical elements. The lens 116 can direct the light emitted by the one or more LED arrays 112 toward the scene 104 as illumination 102. In some embodiments, the flash module 110 can include an actuator (such as a voice-coil motor) to translate (e.g., a physical translation or movement of the LED arrays 112 relative to the lens 116) the one or more LED arrays 112 and/or the lens 116 during the exposure duration of the camera 120 controlled by the processor 130 so as to blur the dark bands in the illumination 102 in the image of the scene 104. In other embodiments, the actuator may not be present. Instead, such a system may have a fixed lens, and thus fixed aperture. In systems that contain the actuator, the actuator can translate the one or more LED arrays 112 and/or the lens 116 in an actuation direction that is generally orthogonal to a longitudinal axis that extends from the one or more LED arrays 112, through a center of the lens 116, to the scene 104 by a distance greater than or equal to a width of a non-emitting area of the one or more non-emitting areas of the one or more LED arrays 112. That is, the actuator can translate either or both the one or more LED arrays 112 and the lens 116 in one or more of the lateral (x-z) directions, where the y direction is shown in FIG. 2 as changing the distance separating the one or more LED arrays 112 and the lens 116. The actuator can oscillate the one or more LED arrays 112 and/or the lens 116 with an oscillation period that is less than the exposure duration of the camera 120.

In addition, or instead of translation, multiple one or more LED arrays containing segmented LEDs may be used to illuminate the scene. In this case, the non-emitting areas between the LEDs that form dark bands in the illumination can be offset between different one or more LED arrays so that the dark bands may at least partially overlap. The offset can help reduce or eliminate dark bands in the total illumination at the scene, which could be present if only one of one or more LED arrays and lens were used.

The camera 120 may sense light at least the wavelength or wavelengths emitted by the one or more LED arrays 112. The camera 120 can include optics (e.g., at least one camera lens 122) that can collect reflected light 106 that is reflected from and/or emitted by the scene 104. The camera lens 122 can direct the reflected light 106 onto a multi-pixel sensor 124 to form an image of the scene 104 on a multi-pixel sensor 124. The processor 130 can receive a data signal that represents the image of the scene 104. The processor 130 can additionally drive the LEDs 114 in the one or more LED arrays 112. For example, the processor 130 can optionally control one or more LEDs 114 in the one or more LED arrays 112 independent of another one or more LEDs 114 in the one or more LED arrays 112, so as to illuminate the scene in a specified manner.

In addition, one or more detectors 126 may be incorporated in the camera 120. In other embodiments, instead of being incorporated in the camera 120, the one or more detectors 126 may be incorporated in one or more different areas, such as the flash module 110 or elsewhere close to the camera 120 and strobe. The one or more detectors 126 may include multiple different sensors to sense visible and/or infrared light (and perhaps ultra-violet light) to sense the ambient light and/or variations/flicker in the ambient light in addition to reception of the reflected light from the LEDs 114. The multi-pixel sensor 124 of the camera 120 may be of higher resolution than the sensors of the one or more detectors 126 to obtain an image of the scene with a desired resolution. The sensors of the one or more detectors 126 may have one or more segments (that are able to sense the same wavelength/range of wavelengths or different wavelength/range of wavelengths). In some embodiments, if multiple detectors are used, one or more of the detectors may detect visible wavelengths and one or more of the detectors may detect infrared wavelengths; the detectors may be individually controllable by the processor 130.

In some embodiments, instead of or in addition to being provided in the camera 120, one or more of the sensors of the one or more detectors 126 may be provided in the flash module 110. In some embodiments, the flash module 110 and the camera 120 may be integrated in a single module, while in other embodiments, the flash module 110 and the camera 120 may be separate modules that are disposed on a PCB. In other embodiments, the flash module 110 and the camera 120 may be attached to different PCBs—for example, as the camera 120 may be thicker than the flash module 110, which may result in design issues if the flash module 110 and the camera 120 are attached to the same PCB. In the latter embodiment, multiple openings may be present in the housing at least one of which may be eliminated with the use of an integrated version of the flash module 110 and the camera 120.

The LEDs 114 can be driven using, for example, a direct current (DC) driver or pulse width modulation (PWM). Using DC driving may encounter color differences if the segmented one or more LED arrays 112 is driven at different current densities, while PWM driving can generate artifacts due to ambient lighting conditions. The flicker sensor may sense the variation of artificial lighting at the wall current frequency or electronic ballasts frequencies (e.g., 50 Hz or 60 Hz or an integral multiple thereof), in addition to the phase of the flicker. The camera sensor is then tuned to an integration time of an integral multiple of the time period (1/f) or triggered at the phase where the illumination changes most slowly (minimum or maximum intensity, with the maximum intensity preferred for signal-to-noise ratio considerations). The LEDs 114 may be driven using a PWM whose phase shift varies between LEDs 114 to reduce potential current surge issues. As shown, one or more drivers 132 may be used to drive the LEDs 114 in the one or more LED arrays 112, as well as other components, such as the actuators.

The mobile device 100 can also include an input device, for example, a user-activated input device such as a button that is depressed to take a picture. The flash module 110 and camera 120 can be disposed in a single housing.

FIG. 2 illustrates an LED array 200, in accordance with some examples. The LEDs 202, which are segmented in the LED array 200, can form corresponding illumination regions in the illumination 102 at the scene 104. The non-emitting areas 204 can form dark bands in the illumination 102 at the scene 104. In some examples, the dark bands in the first illumination 102 at the scene 104 can correspond to the non-emitting areas 204 that extend along a first direction and non-emitting areas that extend along a second direction that is generally orthogonal to the first direction. In some examples, the LEDs 202 can be arranged in a rectilinear array along orthogonal first and second dimensions. In some examples, each of the non-emitting areas 204 can be arranged as an elongated area that extends along one of the first or second dimensions. In some examples, at least one of the non-emitting areas 204 (corresponding to dark bands) can extend in an unbroken line along a full extent of the first rectilinear array. In some examples, at least one of the non-emitting areas 204 can include a plurality of segments that are parallel. In other embodiments, in which multiple ones of the LED array 200 are used, the non-emitting areas 204 of the LED arrays 200 may not be coincident and/or may differ (e.g., only one may have a discontinuity).

In other embodiments, the LED array 200 is a micro-LED array that includes, for example, thousands to millions of microscopic LED pixels that can emit light and that can be individually controlled or controlled in groups of pixels (e.g., 5×5 groups of pixels). The microLEDs are small (e.g., <0.01 mm on a side) and may provide monochromatic or multi-chromatic light, typically red, green, and blue using inorganic semiconductor material.

As above, the flash module 110 of FIG. 1 may be an adaptive flash that contains individually addressable LED segments to allow selective illumination of the scene 104. For array sizes larger than 3×3 matrices, the LED segments may be combined with an integrated driver to allow the function of individual addressability and obtain the small form factor desired for mobile devices without creating issues in layout of the semiconductor layers used to create the integrated devices. In addition, the integration of the driver and LED in a single device increases the thermal challenges of the overall structure due to the increased thermal load on the combined structure. Moreover, as above, the number of openings in the housing of the mobile device may be reduced in embodiments in which a sensor for ambient light and/or flicker detection is integrated in the flash module/camera. Limitations on the number of openings in the housing may increase structural integrity of the housing, as well as improving the industrial design of the mobile device.

Figure 3:
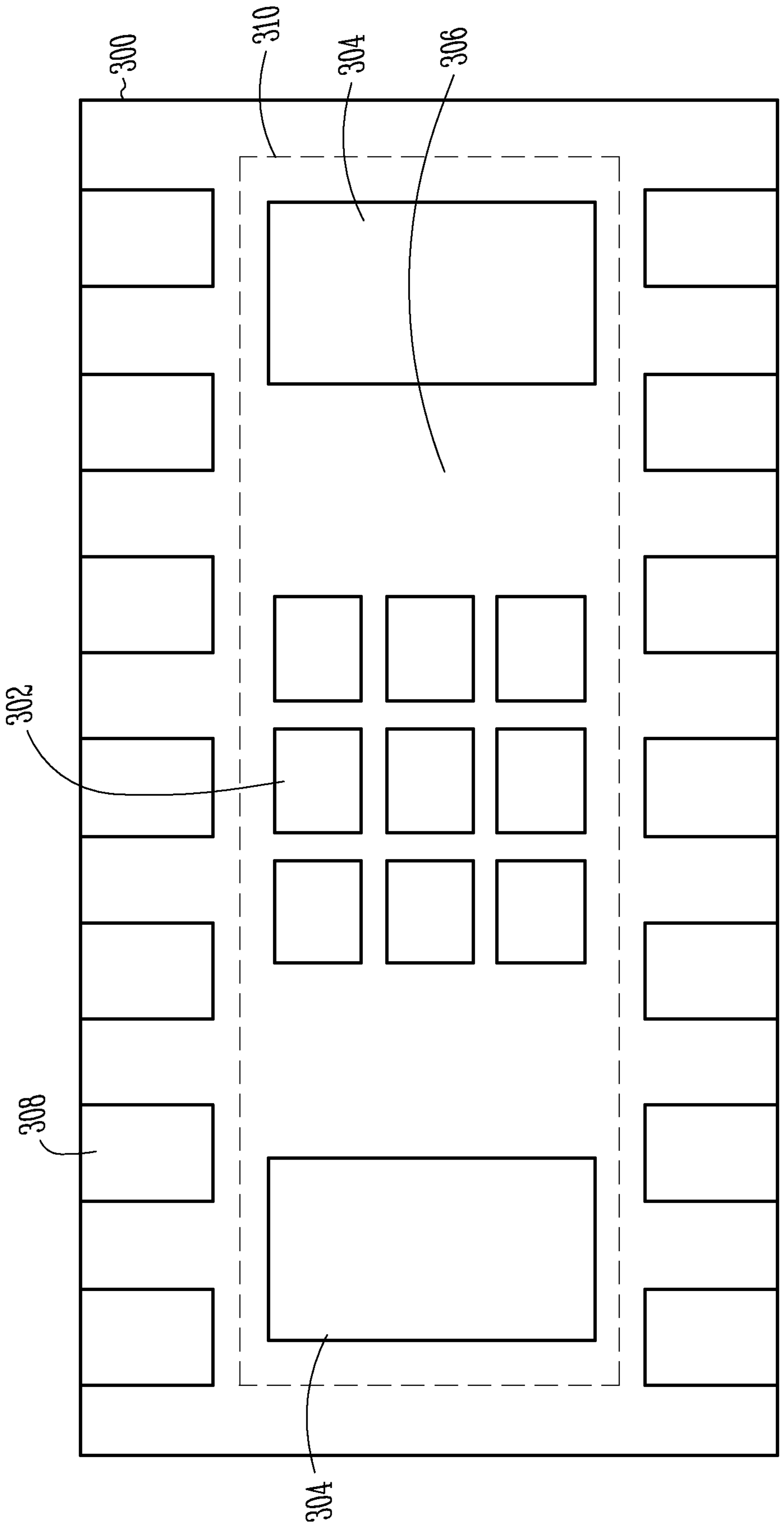
FIG. 3 illustrates a top view of a structure, according to some embodiments.

FIG. 3 illustrates a top view of a structure 300, according to some embodiments. Only some of the elements in the structure 300 are shown in FIG. 3. The structure 300 may include, among others, an LED matrix 302, multiple sensors 304, and a driver 306. The structure 300 may be disposed on, for example, a compound metal oxide semiconductor (CMOS) backplane or a glass backplane on which semiconductor materials may be deposited to form the transistors to control individual pixel units of the LED matrix 302. The structure 300 may be attached to a PCB (not shown in FIG. 3) or a polyethylene-terephthalate (PET) film deposited or otherwise formed with a semiconductor layer. Various electronic components may be provided on the PCB, such as a processor, a memory, and a PWM generator (or current generator) among others. The structure 300 may contain contact pads 308 used for input and output data signals, test signals, power and the like.

The LED matrix 302 and the sensors 304 may be integrated on a semiconductor structure such as a CMOS chip 310. As is apparent, the amount of space used by the LED matrix 302 and the sensors 304 correspondingly increases the amount of semiconductor used and enlarges the CMOS chip 310. In addition to increasing the CMOS area, the integration of the LED matrix 302 and the sensors 304 may reduce the number of power and communication contacts. The increase in the CMOS area may improve the thermal design of the CMOS chip 310 by providing additional area to help dissipate heat. In some embodiments, a heat sink may also be disposed on extended areas of the CMOS chip 310.

The sensors 304 may be of the same type and may be arranged to be symmetric to the LED matrix 302. This arrangement may permit detection that is spatially symmetrical. In particular, in such an embodiment, the CMOS chip 310 that contains the LED matrix 302 and the sensors 304 may be positioned in the flash module 110 of FIG. 1 below the lens 116 used to image the LED matrix. In this case, the lens 116 and LED array 112 may form the optical axis. As shown in FIG. 3, the sensors 304 are on opposing sides of the LED matrix 302. If the sensors 304 are arranged on both sides of the LED matrix 302, the detection through the common lens becomes spatially symmetric. In other embodiments, the sensors 304 may be disposed on all (4) sides of the LED matrix 302. In other embodiments in which the LED matrix 302 is non-rectangular (e.g., octagonal), a greater number of the sensors 304 may be disposed symmetrically around the perimeter of the LED matrix 302.

In other embodiments, sensors other than flicker sensors may be additionally disposed around the LED matrix 302 or integrated into the structure 300. These sensors may include other optical sensors (such as a red, green, blue (RGB) ambient light sensor) or non-optical sensors, such as accelerometers, gyroscopes, or near field communication (NFC) sensors. As above, the LED matrix 302 may be segmented into one or more LED array, and either the LEDs within each LED array may be driven individually or the LED arrays themselves may be driven individually.

Figure 4:
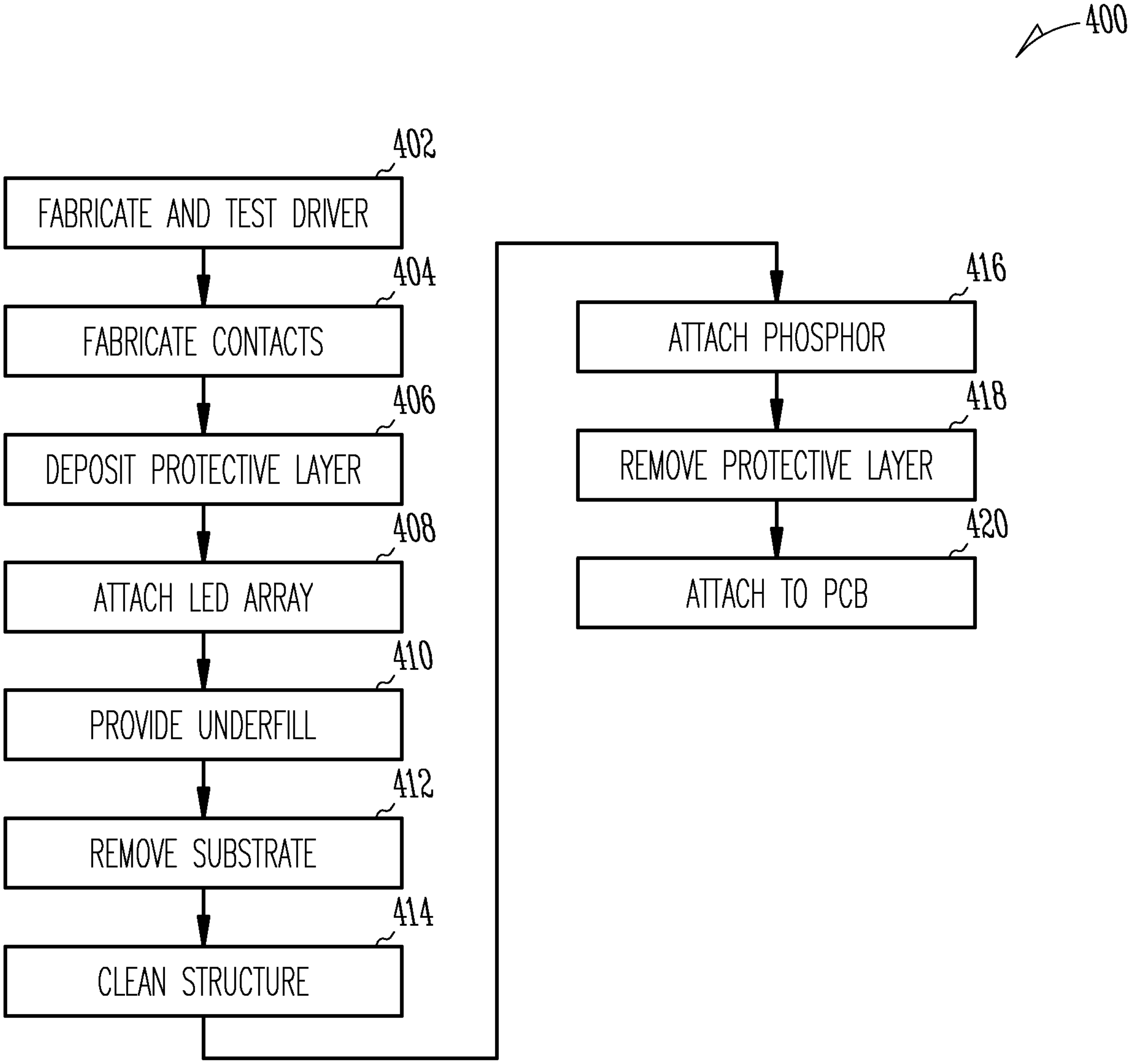
FIG. 4 illustrates a simplified flow diagram for fabricating an LED structure in accordance with some embodiments.

FIG. 4 illustrates a simplified flow diagram for fabricating an LED structure in accordance with some embodiments. FIGS. 5A-5E show LED structures at different points within the method 400 described in FIG. 4. Note that only some operations of the method 400 are shown; other operations may be present but are not shown for convenience. At operation 402, the driver described above may be fabricated in a semiconductor structure using conventional semiconductor processes, including photolithography, etching, metallization, deposition, and cleaning processes. The driver may be formed in silicon (Si) or any other suitable semiconductor, or in a semiconductor layer formed on or in a dielectric material. The driver may have multiple semiconductor, metal, and insulating (e.g., oxide) layers to provide the active circuitry and contacts, among others. Performance tests of the driver may be undertaken prior to the further processes below being performed.

Once the driver has been tested and the response is found to be acceptable according to a set of predetermined criteria, at operation 404 contacts may be fabricated on the semiconductor structure. The contacts may include PCB contacts to be used to connect to the PCB and LED contacts to be used to connect to the LED array structure. The PCB contacts may include one or more of input/output, test, power, and ground contacts, for example. The PCB contacts may be formed, for example, as wirebonds, copper (Cu) pillars, or solder bumping that uses through substrate vias (TSV); the LED contacts may be formed using, for example, copper (Cu) pillars.

Figure 5A:
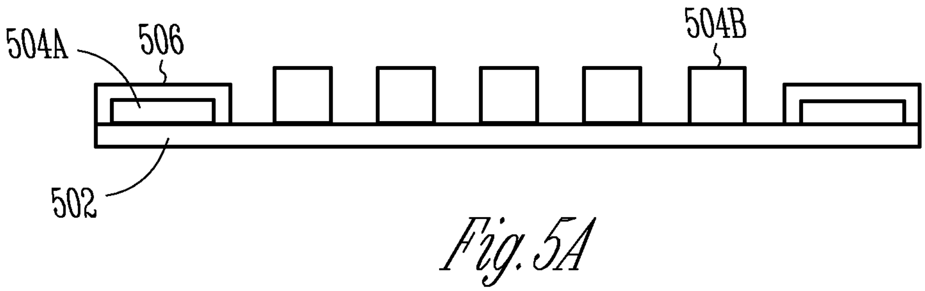
FIGS. 5A-5E show embodiments of LED structures at different points within the method described in FIG. 4.

At operation 406, a protective layer may be deposited on a semiconductor structure 502. Upon reading and understanding the disclosed subject matter, a person of ordinary skill in the art will recognize that non-semiconductor structures (e.g., a dielectric structure with one or more semiconductor films formed thereon) may be used as well. The overall structure is shown in FIG. 5A. In particular, as shown in FIG. 5A, a protective layer 506, such as a resist, may be deposited on the semiconductor structure 502 to protect the PCB contacts 504*a* while leaving the solder bumps forming the LED contacts 504*b* exposed.

At operation 408, a CMOS chip containing the LED array and sensors may be attached to the semiconductor structure 502. As above, surface mount technology may be used to mount the CMOS chip on the solder bumps (LED contacts 504*b*). Alternatively, Cu pillars may be used to wafer bond the LED die to the CMOS chip.

Figure 5B:
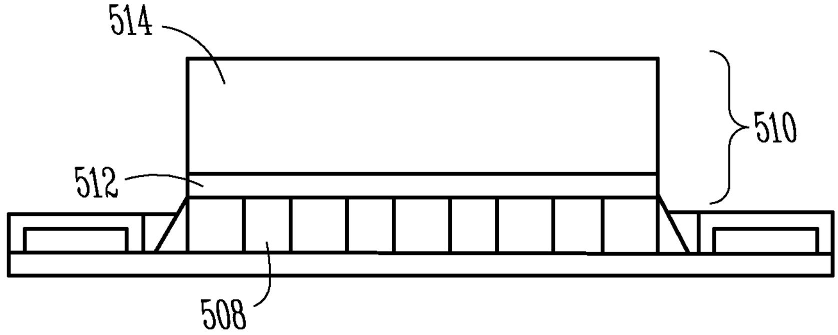

At operation 410, and shown in shown in FIG. 5B, underfill 508 may be used to fill the gap between the CMOS chip 510 containing the integrated LED array and sensor structure 512 and substrate 514 may be attached to the semiconductor structure 502. The underfill may be formed from resin or Si epoxy, for example. That is, the LED array and sensor structure 512 are fabricated on the substrate 514 using semiconductor processes such as that described below (e.g., deposition, etching, plating) to be integrated to the same overall set of layers.

Figure 5C:
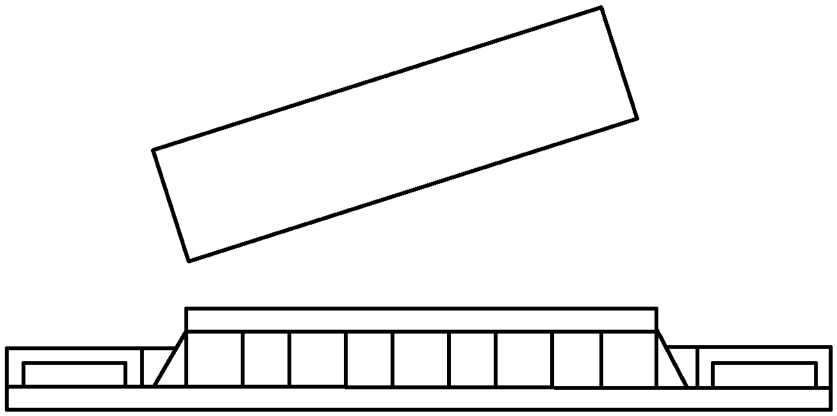

At operation 412, and shown in shown in FIG. 5C, the substrate 514 on which the LED array and sensor structure 512 is grown may be removed. In some cases, the substrate 514 may be formed from sapphire, and a lift off and/or laser ablation process may be used to remove the substrate 514. Thus, only the integrated LED array and sensor structure 512 remains attached to the semiconductor structure 502 via the LED contacts 504*b* and the underfill 508.

At operation 414, the integrated LED array and sensor structure 512 remaining after liftoff may be cleaned using solvents and deionized water, for example. The integrated LED array and sensor structure 512 may then be, for example, visually or optically inspected for defects and impurities prior to undertaking further fabrication processes.

Figure 5D:
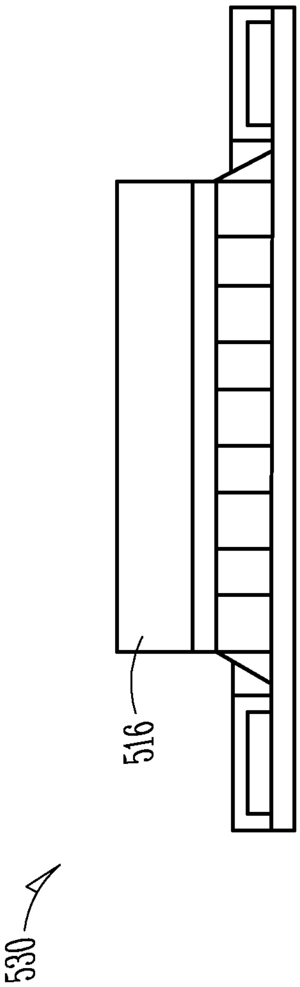

After cleaning and inspection, at operation 416, and shown in FIG. 5D, a phosphor layer 516 may be attached to or otherwise laminated or formed on the integrated the LED array and sensor structure 512. The addition of the phosphor layer 516 may generate white (or other colored) light from the light emitted by the LED array. In some embodiments, the LED may produce light having a wavelength that can be in a blue or violet portion of the visible spectrum. The light from the LED may be used to excite phosphor in the phosphor layer 516, which, after absorption of some or all of the light, can emit light at wavelengths that are longer than the excitation wavelength to create white light. The overall LED/sensor structure 530 is shown in FIG. 5D.

After deposition of the phosphor layer 516, at operation 418 the protective layer 506 (e.g., resist, see FIG. 5A) may be removed from the underlying structure. In particular, the protective layer 506 may be removed from the PCB contacts 504*a* on the semiconductor structure 502.

Figure 5E:
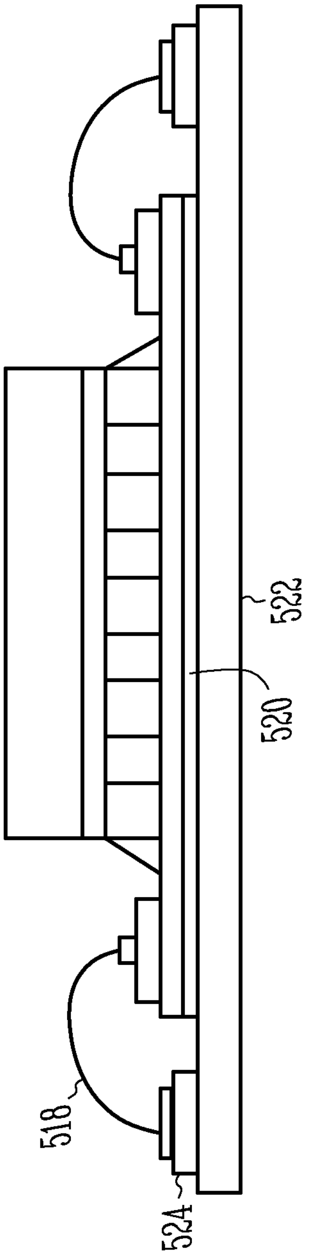

After removal of the protective layer 506, at operation 420 and shown in shown in FIG. 5E, the semiconductor structure 502 may be attached to the PCB 522 via a bonding layer 520. The bonding layer 520 may be epoxy, for example. After the semiconductor structure 502 is attached to the PCB 522, the PCB contacts 504*a* may be wire bonded to corresponding PCB contacts 524 on the PCB 522 using wire bonds 518.

Other layers and structures may be added to the above. For example, multiple phosphor layers or reflective layers to better direct the light may be added to the structure shown in FIGS. 5A-5E. Thus, as shown, the integrated semiconductor structure includes the LED array and sensor structure 512, which are integrated on a single CMOS chip.

Figure 6:
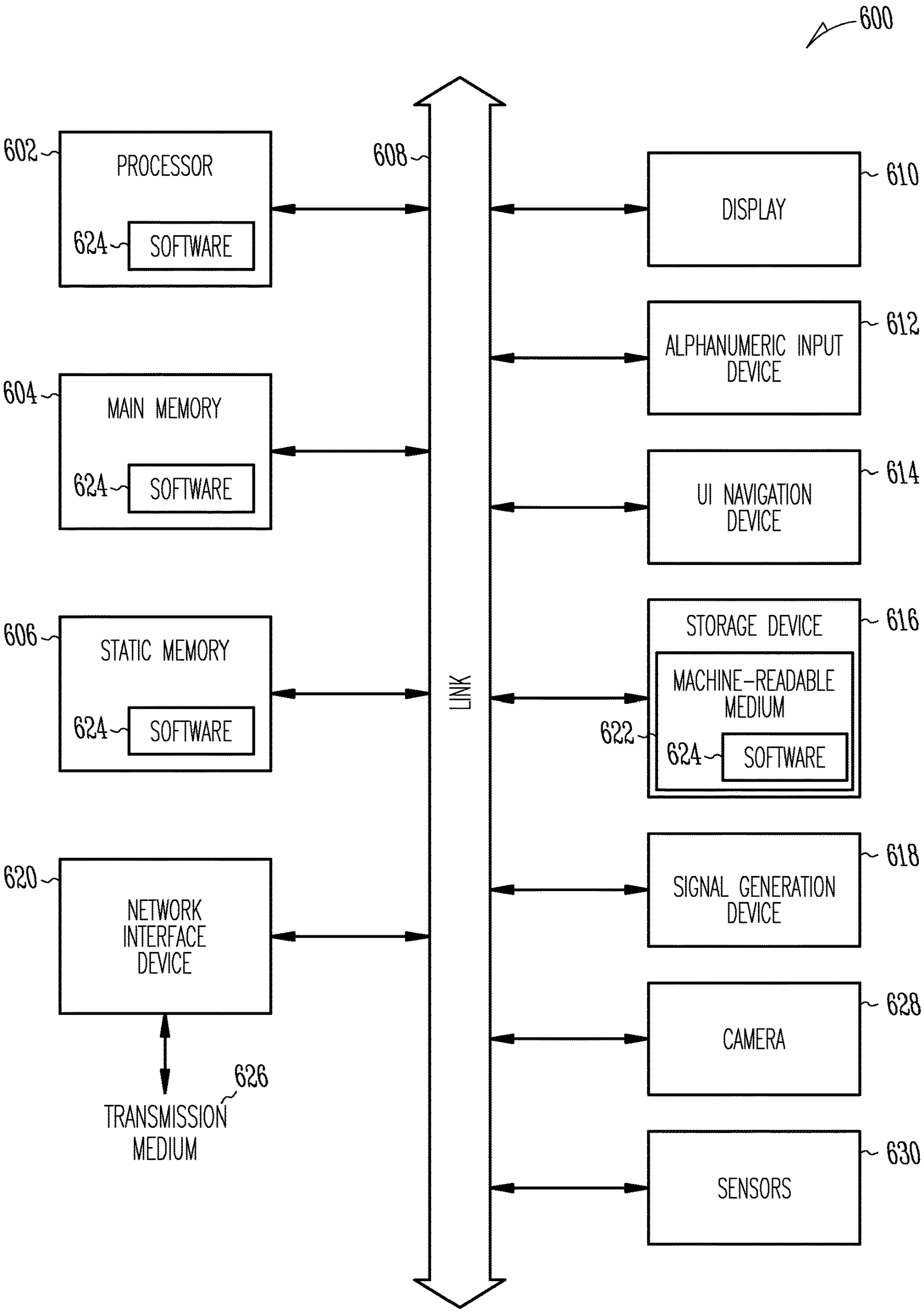
FIG. 6 illustrates a block diagram of a mobile device in accordance with some embodiments.

FIG. 6 illustrates a block diagram of a mobile device in accordance with some embodiments. The mobile device 600 may be a UE such as a specialized computer, a personal or laptop computer (PC), a tablet PC, or a smart phone. Various elements may be provided on the PCB indicated above. Examples, as described herein, may include, or may operate on, logic or a number of components, modules, or mechanisms. Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The mobile device 600 may include a hardware processor (or equivalently processing circuitry) 602 (e.g., a central processing unit (CPU), a GPU, a hardware processor core, or any combination thereof), a main memory 604 and a static memory 606, some or all of which may communicate with each other via an interlink (e.g., bus) 608. The main memory 604 may contain any or all of removable storage and non-removable storage, volatile memory or non-volatile memory. The mobile device 600 may further include a display 610 such as a video display, an alphanumeric input device 612 (e.g., a keyboard), and a user interface (UI) navigation device 614 (e.g., a mouse). In an example, the display 610, input device 612 and UI navigation device 614 may be a touch screen display. The mobile device 600 may additionally include a storage device (e.g., drive unit) 616, a signal generation device 618 (e.g., a speaker), a network interface device 620, one or more cameras 628, and one or more sensors 630, such as a global positioning system (GPS) sensor, compass, accelerometer, or other sensor such as those described herein. The mobile device 600 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 616 may include a non-transitory machine readable medium 622 (hereinafter simply referred to as machine readable medium) on which is stored one or more sets of data structures or instructions 624 (e.g., software) embodying or utilized by any one or more of the techniques or functions described herein. The instructions 624 may also reside, completely or at least partially, within the main memory 604, within static memory 606, and/or within the hardware processor 602 during execution thereof by the mobile device 600. While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the mobile device 600 and that cause the mobile device 600 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 624 may further be transmitted or received over a communications network using a transmission medium 626 via the network interface device 620 utilizing any one of a number of wireless local area network (WLAN) transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.15.4 family of standards, a Long Term Evolution (LTE) family of standards, a Universal Mobile Telecommunications System (UNITS) family of standards, peer-to-peer (P2P) networks, a next generation (NG)/5$^{th}$ generation (5G) standards among others. In an example, the network interface device 620 may include one or more physical jacks (e.g., Ethernet, coaxial, or phone jacks) or one or more antennas to connect to the transmission medium 626.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

In addition to reducing the number of contacts, improving the thermal issues of the CMOS device, and reducing the number of openings in the housing of the mobile device, integration of the LED matrix and the flicker sensor in the CMOS device may enable use of the flicker sensor to control a minimum current through each of the LEDs to produce a white appearance from the overall structure. In particular, variations are present in the various layers (semiconductor and otherwise) due to a variety of issues, including, among others, variations in gas flows and etch rates over the wafer used to fabricate the integrated structure. Such variations may create large operational variations in the emission of the LEDs at low applied currents. This may cause issues as, at relatively low or no currents, the LED array may appear yellowish/orange due to the presence of the phosphor; to make the LED array appear white (typically desirable), the LEDs may be activated with at least a minimum amount of current, which may vary from LED to LED due to the abovementioned manufacturing variability. This minimum amount of current may cause the LEDs to emit light at an intensity greater than that of the ambient light. However, due to the LED variation at low current, the ability to provide white light (either intensity or color) across the LED array may not be uniform. Accordingly, it may be desirable to individually control the current to the LEDs to account for variations in the LED manufacturing and adjust for the amount of ambient light. The flicker sensor, which is formed on the same structure as the LEDs, may be used by the processor on the PCB to help tune the current to the individual LEDs to avoid such variations. The amount of current for applied to each LED to ensure that the LED appears white may be calibrated during manufacturing.

In addition, although multiple lenses are shown in FIG. 1, in certain embodiments, it may be desirable for a single lens to be used for a number of reasons. For example, by arranging the sensor symmetrically around the LED, and thereby the lens, the detection provided by the sensor may be spatially more symmetrical. That is, the field of view (FOV) with respect to the lens may be symmetric instead of off-axis (the sensor signal may be more off-axis from the lens when separate). Of course, in other embodiments, one or more individual lens elements may be provided for the flicker sensor. In some embodiments, to maintain a whitish appearance of the LED array, the sensor may detect the reflection at the lens under dark conditions to tune the current to a designed flux output level, depending on the ambient light level. In some embodiments, synchronous detection of pulsed LED emission may help to increase the sensitivity.

Figure 7C:
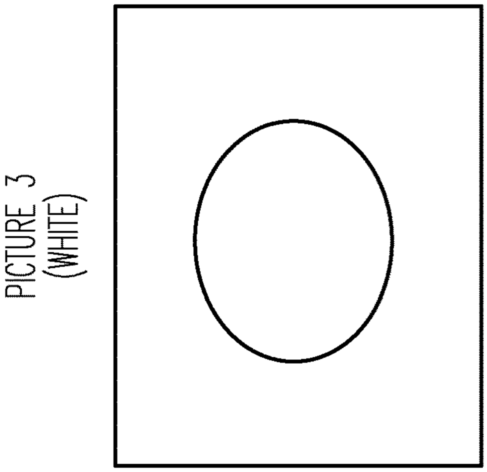
FIGS. 7A-7C illustrate an LED under low ambient lighting using different driving currents in accordance with some embodiments.
Figure 7B:
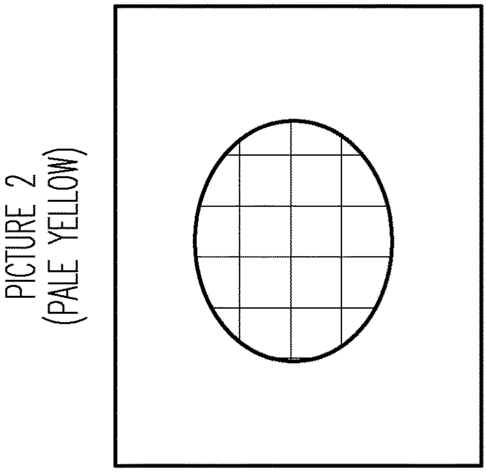
Figure 7A:
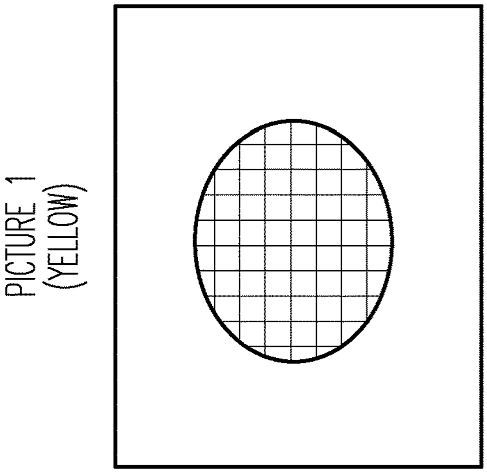

FIGS. 7A-7C illustrates an LED under low ambient lighting using different driving currents accordance with some embodiments. In particular, FIGS. 7A-7C show a comparison in the LED appearance under 50 lux ambient lighting in which FIG. 7A shows 0 A applied to each of the LEDs in the LED array (essentially a yellow LED array), FIG. 7B shows 10 μA applied to each of the LEDs (essentially a pale yellow LED array), and FIG. 7C shows 20 μA applied to each of the LEDs (essentially a white LED array), although the current values depend on the individual LED.

Figure 8A:
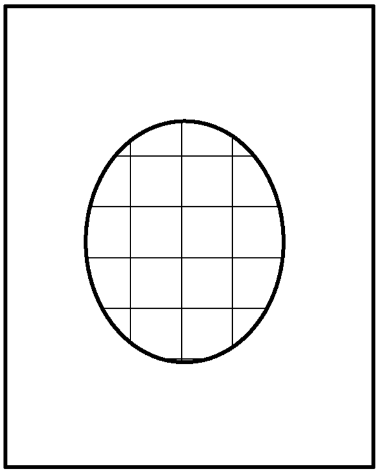
FIGS. 8A and 8B illustrate an LED under high ambient lighting using different driving currents accordance with some embodiments.
Figure 8B:
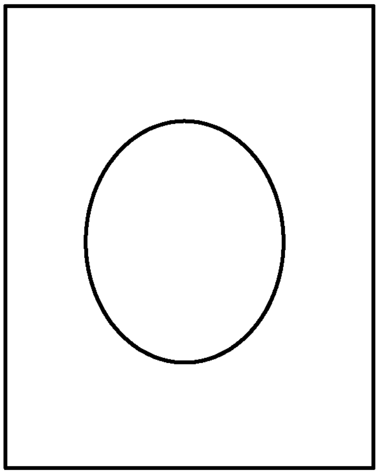

FIGS. 8A-8B illustrates an LED under high ambient lighting using different driving currents accordance with some embodiments. In particular, FIGS. 8A-8B show a comparison in the LED appearance under 3500 lux ambient lighting in which FIG. 8A shows 0 A applied to each of the LEDs (essentially a yellow LED array) and FIG. 8B shows 100 μA applied to each of the LEDs (essentially a white LED array).

While only certain features of the system and method have been illustrated and described herein, many modifications and changes will occur to those skilled in the art. It is, therefore, to be understood that the appended claims are intended to cover all such modifications and changes. Method operations can be performed substantially simultaneously or in a different order.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A light-emitting diode (LED) structure comprising:

an integrated monolithic Complementary Metal-Oxide-Semiconductor (CMOS) semiconductor structure comprising:

an LED matrix comprising one or more LED arrays, each LED array comprising a plurality of LEDs separated by non-emitting areas, the plurality of LEDs configured to be driven independently to provide light; and sensors symmetrically disposed on a plurality of edges of the LED matrix, the sensors configured to detect ambient light, each of the plurality of LEDs configured to be independently driven with a minimum amount of current to produce white light, the minimum amount of current for each LED being determined based on an amount of ambient light detected by the sensors.

2. The LED structure of claim 1, wherein at least one of the sensors is a flicker sensor.

3. The LED structure of claim 1, wherein the sensors are disposed on opposing sides of the LED matrix.

4. The LED structure of claim 1, wherein the sensors are disposed on all edges of the LED matrix.

5. The LED structure of claim 1, further comprising a phosphor disposed on the LED matrix.

6. The LED structure of claim 1, further comprising a driver configured to drive the LED matrix, the semiconductor structure coupled to the driver via conductive pillars and underfill between the conductive pillars.

7. The LED structure of claim 1, further comprising a printed circuit board (PCB) having a plurality of PCB contacts, the semiconductor structure having a plurality of LED contacts, the semiconductor structure mounted on the PCB, the PCB electrically coupled to the semiconductor structure via the plurality of PCB contacts and the plurality of LED contacts.

8. The LED structure of claim 1, wherein the semiconductor structure further comprises an optical sensor or non-optical sensor.

9. The LED structure of claim 1, wherein the minimum is based on both the amount of ambient light and manufacturing variation across the LED array.

10. A mobile device comprising:

a monolithic Complementary Metal-Oxide-Semiconductor (CMOS) semiconductor structure comprising:

a light-emitting diode (LED) matrix comprising one or more LED arrays, each LED array comprising a plurality of LEDs separated by non-emitting areas, the plurality of LEDs configured to be driven independently to provide light;

sensors symmetrically disposed on a plurality of edges of the LED matrix, the sensors configured to detect ambient light; and a plurality of LED contacts;

a driver configured to drive the LED matrix, the semiconductor structure coupled to the driver via conductive pillars and underfill between the conductive pillars, each of the plurality of LEDs configured to be independently driven by the driver with a minimum amount of current to produce white light, the minimum amount of current for each LED being determined based on an amount of ambient light detected by the sensors; and a printed circuit board (PCB) coupled to the driver, the PCB having a plurality of PCB contacts, the PCB electrically coupled to the semiconductor structure via the plurality of PCB contacts and the plurality of LED contacts.

11. The mobile device of claim 10, wherein at least one of the sensors is a flicker sensor.

12. The mobile device of claim 10, wherein the sensors are disposed on opposing edges of the LED matrix.

13. The mobile device of claim 10, wherein the sensors are disposed on all sides of the LED matrix.

14. The mobile device of claim 10, further comprising a phosphor disposed on the LED matrix.

15. The mobile device of claim 10, wherein the sensors are further configured to detect flicker in the ambient light.

16. The mobile device of claim 10, wherein:

the mobile device further comprises a processor, and the processor is configured to determine the amount of ambient light based on signals from the ambient light sensors and control the driver to drive each of the plurality of LEDs independently to produce white light using the minimum amount of current that depends on the amount of ambient light determined.

17. The mobile device of claim 10, further comprising a single lens configured to be used for both the LED matrix and the sensors.

18. The mobile device of claim 10, wherein the minimum is based on both the amount of ambient light and manufacturing variation across the LED array.

19. A method of fabricating a light-emitting diode (LED) structure, the method comprising:

coupling a monolithic semiconductor structure to a semiconductor driver using conductive pillars, the monolithic semiconductor structure comprising:

an LED matrix comprising one or more LED arrays, each LED array comprising a plurality of LEDs separated by non-emitting areas, the plurality of LEDs configured to be driven independently to provide light, a sensor disposed on opposing edges of the LED matrix, the sensor configured to detect ambient light, and a substrate on which the LED matrix and sensor are fabricated;

providing underfill between the conductive pillars to adhere the monolithic semiconductor structure to the semiconductor driver, the semiconductor driver configured to drive the LED matrix;

depositing a phosphor on the monolithic semiconductor structure, the phosphor configured to emit white light when light from the LED matrix impinges on the phosphor; and lifting off the substrate after the underfill is provided.

20. The method of claim 19, further comprising:

attaching the semiconductor driver to a printed circuit board (PCB) having a plurality of PCB contacts, the monolithic semiconductor structure having a plurality of LED contacts, the monolithic semiconductor structure mounted on the PCB, and electrically coupling the PCB to the monolithic semiconductor structure via the plurality of PCB contacts and the plurality of LED contacts.

* * * * *